United States Patent
Soda et al.

(10) Patent No.: US 9,768,213 B2
(45) Date of Patent: Sep. 19, 2017

(54) SOLID-STATE IMAGE SENSOR AND CAMERA

(71) Applicant: CANON KABUSHIKI KAISHA, Tokyo (JP)

(72) Inventors: Takehiko Soda, Yokohama (JP); Masahiro Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/163,986

(22) Filed: May 25, 2016

(65) Prior Publication Data

US 2016/0360126 A1 Dec. 8, 2016

(30) Foreign Application Priority Data

Jun. 3, 2015 (JP) .................................. 2015-113350
Feb. 23, 2016 (JP) .................................. 2016-032425

(51) Int. Cl.
  *H04N 5/335* (2011.01)
  *H01L 27/146* (2006.01)
  *H04N 5/369* (2011.01)

(52) U.S. Cl.
  CPC .... *H01L 27/14612* (2013.01); *H01L 27/1461* (2013.01); *H01L 27/1463* (2013.01); *H01L 27/14603* (2013.01); *H01L 27/14641* (2013.01); *H04N 5/3696* (2013.01)

(58) Field of Classification Search
  CPC .............................................. H01L 21/14641
  See application file for complete search history.

(56) References Cited

U.S. PATENT DOCUMENTS

| 8,349,640 | B2 | 1/2013 | Soda |
| 8,456,559 | B2 | 6/2013 | Yamashita et al. |
| 8,552,353 | B2 | 10/2013 | Kobayashi et al. |
| 8,736,005 | B2 | 5/2014 | Kobayashi et al. |
| 8,976,282 | B2 | 3/2015 | Soda |
| 9,094,624 | B2 | 7/2015 | Shimotsusa et al. |
| 9,123,603 | B2 | 9/2015 | Kobayashi et al. |
| 9,147,708 | B2 | 9/2015 | Okita et al. |
| 9,153,610 | B2 | 10/2015 | Kobayashi et al. |
| 9,276,027 | B2 | 3/2016 | Okita et al. |
| 9,344,653 | B2 | 5/2016 | Shimotsusa et al. |
| 2013/0187210 | A1 | 7/2013 | Kobayashi et al. |
| 2014/0061436 | A1 | 3/2014 | Kobayashi |

(Continued)

FOREIGN PATENT DOCUMENTS

JP 2013-084742 A 5/2013

*Primary Examiner* — Gary C Vieaux
(74) *Attorney, Agent, or Firm* — Fitzpatrick, Cella, Harper & Scinto

(57) ABSTRACT

A solid-state image sensor comprising pixels, each including a first region of a first conductivity type, a second region of the first conductivity type formed in a position shifted from the first region in a first direction, a third region of a second conductivity type formed between the first and second regions, a fourth region of the first conductivity type formed in a position shifted from the third region in a second direction, a first gate electrode of a transistor arranged between the first and fourth regions, a second gate electrode of a transistor arranged between the second and fourth regions, and a fifth region of the second conductivity type formed between the first and second gate electrodes and between the third and fourth regions, and a concentration of the fifth region is higher than that of the third region.

10 Claims, 13 Drawing Sheets

(56) References Cited

U.S. PATENT DOCUMENTS

2014/0111663 A1   4/2014  Soda
2014/0307151 A1  10/2014  Soda
2015/0145089 A1   5/2015  Soda
2015/0264283 A1   9/2015  Kobayashi et al.
2015/0341579 A1  11/2015  Kobayashi et al.
2016/0071902 A1   3/2016  Okita et al.

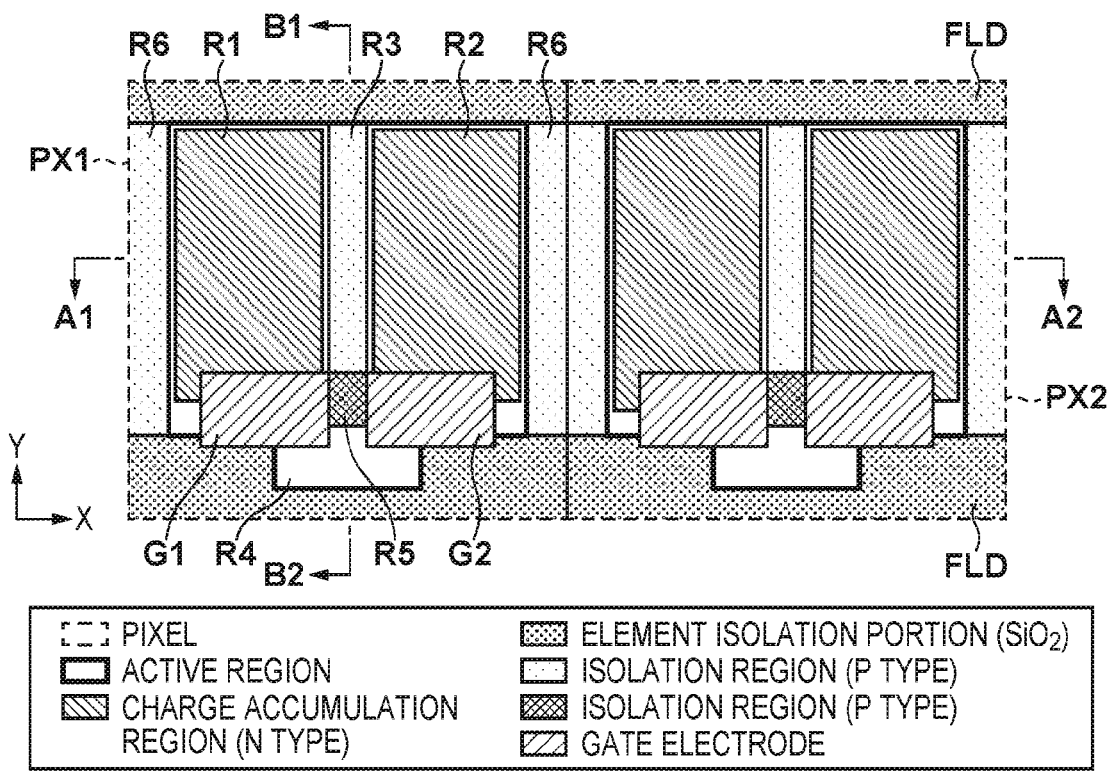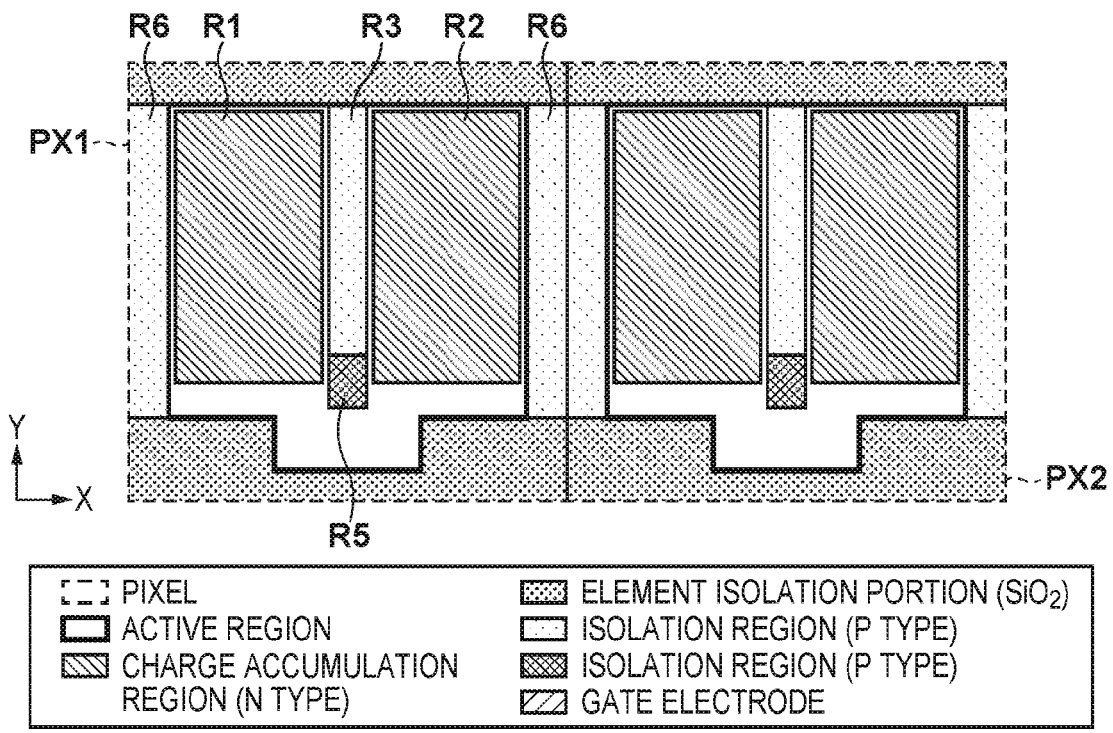

FIG. 7A1
FIG. 7B1
FIG. 7A2
FIG. 7B2
FIG. 7A3
FIG. 7B3
FIG. 7A4
FIG. 7B4
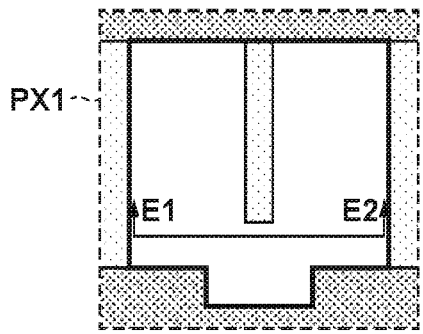
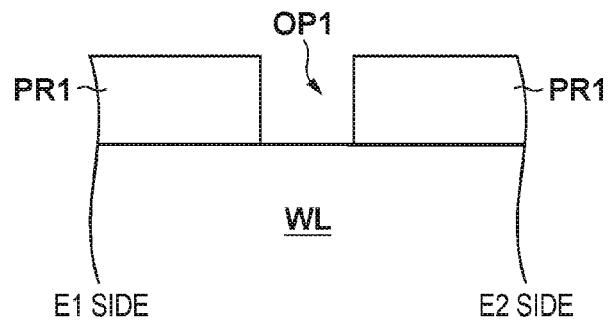
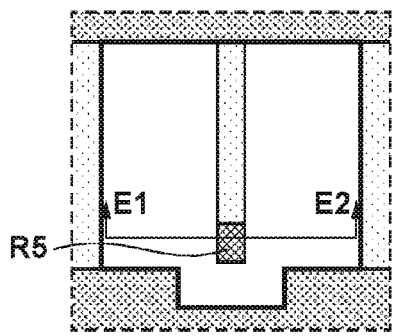
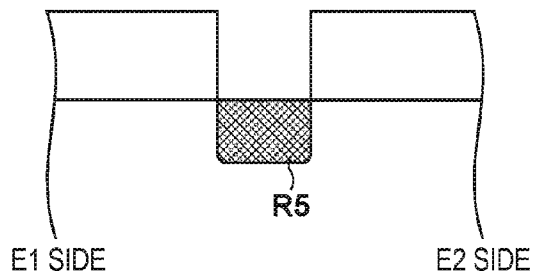
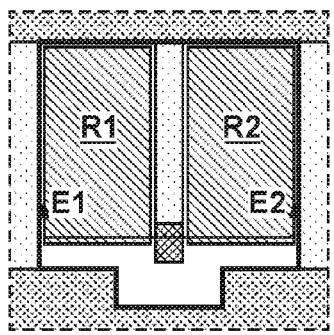
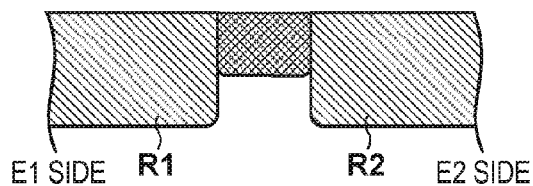
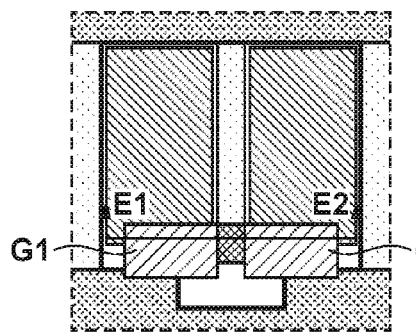
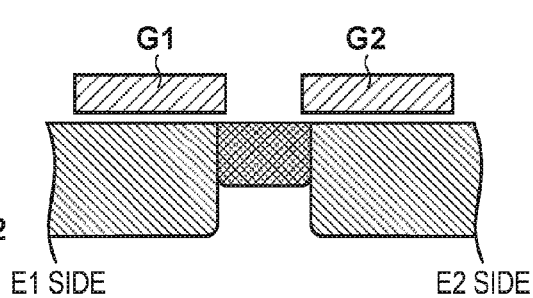

FIG. 10A1
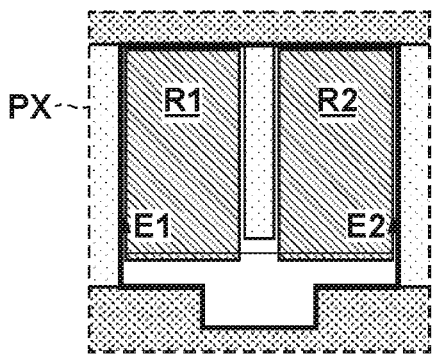
FIG. 10B1
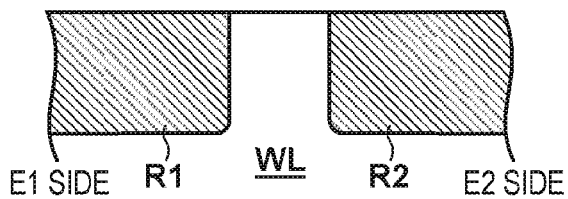
FIG. 10A2
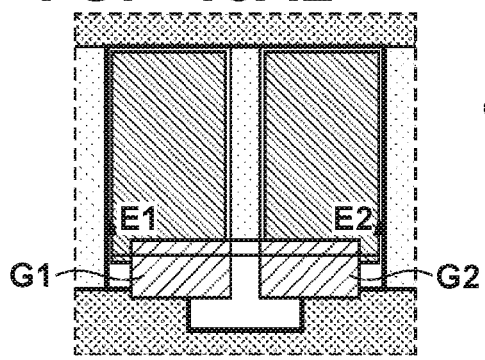
FIG. 10B2
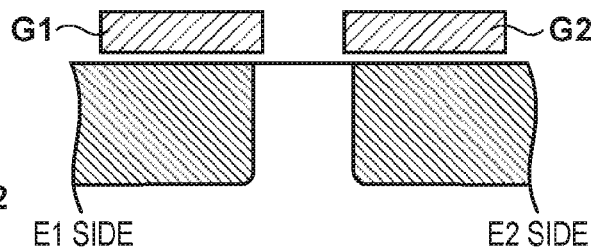
FIG. 10A3
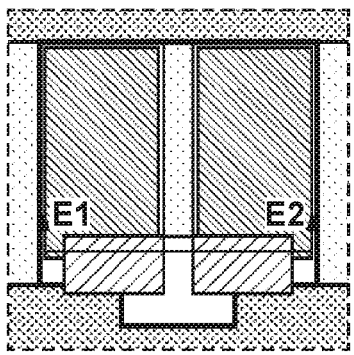
FIG. 10B3
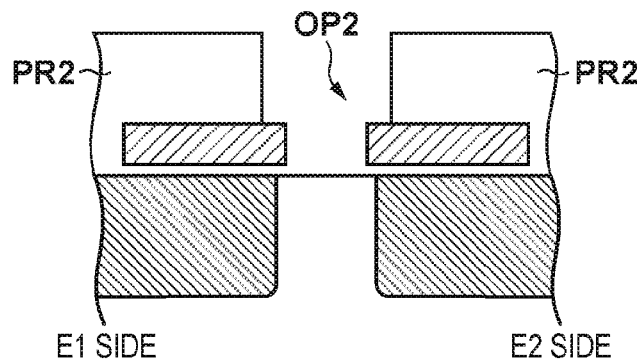
FIG. 10A4
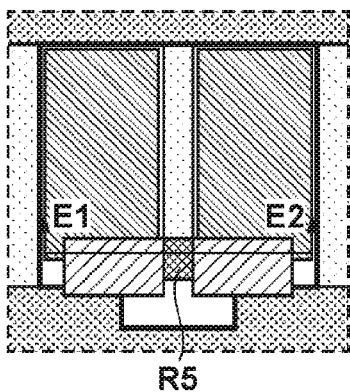
FIG. 10B4
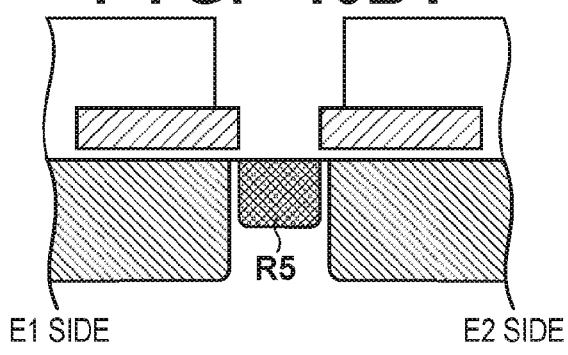

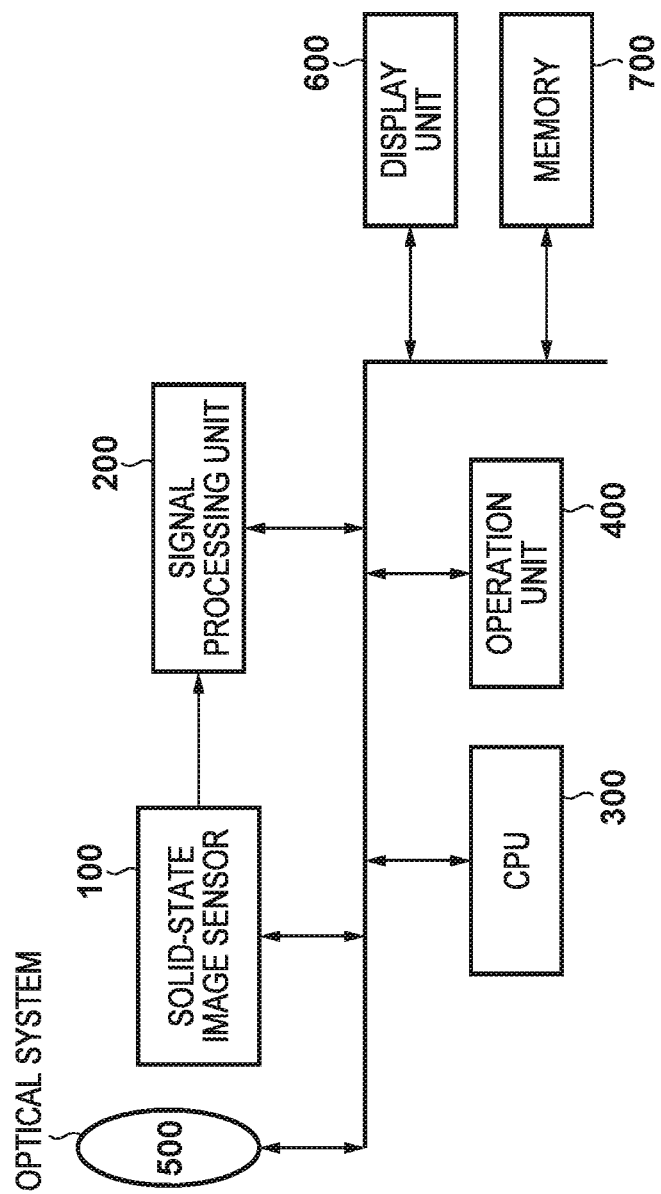

SOLID-STATE IMAGE SENSOR AND CAMERA

BACKGROUND OF THE INVENTION

Field of the Invention

The present invention relates to a solid-state image sensor and a camera.

Description of the Related Art

Solid-state image sensors include, for example, pixel arrays in which a plurality of pixels are arrayed. Some solid-state image sensors include focus detection pixels for performing focus detection arranged in the pixel arrays. Each focus detection pixel can include, for example, a pair of charge accumulation regions, a floating diffusion, and two transfer transistors each transferring a charge accumulated in the pair of charge accumulation regions by photoelectric conversion to the floating diffusion.

More specifically, the charge corresponding to a part of light that has passed through an optical element (for example, a microlens or the like) is accumulated in one charge accumulation region and a charge corresponding to another part of the light is accumulated in the other charge accumulation region. Then, a signal (first signal) corresponding to an accumulated charge amount in one charge accumulation region and a signal (second signal) corresponding to an accumulated charge amount in the other charge accumulation region are used to perform focus detection based on a phase-difference detection method. The first signal and the second signal are added to be processed as a pixel signal, and are also used to form image data.

If the charges accumulated in a charge accumulation region are saturated because an amount of light entering a pixel is sufficiently large, charges further generated from that state by photoelectric conversion (to be referred to as "excess charges" hereinafter) may leak into another pixel adjacent to the pixel.

Japanese Patent Laid-Open No. 2013-84742 has disclosed a structure in which a potential barrier between one charge accumulation region and another charge accumulation region of a pair of charge accumulation regions in each pixel is lower than a potential barrier between adjacent pixels. According to this structure, if charges accumulated in one charge accumulation region are saturated, excess charges can be received in the other charge accumulation region. It is therefore possible to prevent leakage of the excess charges into the adjacent pixels and a decrease in image quality.

According to this structure, however, because the potential barrier between one charge accumulation region and the other charge accumulation region of the pair of charge accumulation regions has been lowered, some of the excess charges may leak into a floating diffusion when the excess charges move from the one charge accumulation region to the other charge accumulation region.

SUMMARY OF THE INVENTION

It is an object of the present invention to provide a technique advantageous in preventing an excess charges which move from one charge accumulation region to the other charge accumulation region of a pair of charge accumulation regions from leaking into a floating diffusion.

One of the aspects of the present invention provides a solid-state image sensor which includes a plurality of pixels arranged on a semiconductor substrate, wherein in a plan view with respect to an upper surface of the semiconductor substrate, each pixel includes a first impurity region of a first conductivity type configured to accumulate charges generated by photoelectric conversion, a second impurity region of the first conductivity type formed in a position shifted from the first impurity region in a first direction and configured to accumulate the charges generated by the photoelectric conversion, a third impurity region of a second conductivity type formed between the first impurity region and the second impurity region, a fourth impurity region of the first conductivity type formed in a position shifted from the third impurity region in a second direction intersecting the first direction, a first gate electrode of a transistor arranged between the first impurity region and the fourth impurity region and configured to transfer the charges from the first impurity region to the fourth impurity region, a second gate electrode of a transistor arranged between the second impurity region and the fourth impurity region and configured to transfer the charges from the second impurity region to the fourth impurity region, and a fifth impurity region of the second conductivity type formed between the first gate electrode and the second gate electrode, and between the third impurity region and the fourth impurity region, and a concentration of an impurity of the second conductivity type in the fifth impurity region is higher than a concentration of an impurity of the second conductivity type in the third impurity region.

Further features of the present invention will become apparent from the following description of exemplary embodiments with reference to the attached drawings.

BRIEF DESCRIPTION OF THE DRAWINGS

FIGS. 2A to 2D are sectional views for explaining an example of the structure of each pixel;

FIGS. 7A1 to 7A4 and 7B1 to 7B4 are sectional views for partially explaining an example of a method of manufacturing a solid-state image sensor;

FIGS. 10A1 to 10A4 and 10B1 to 10B4 are sectional views for partially explaining an example of a method of manufacturing a solid-state image sensor;

FIG. 11 is a block diagram for explaining an example of the arrangement of an imaging system.

DESCRIPTION OF THE EMBODIMENTS

A solid-state image sensor includes a plurality of pixels arranged on a semiconductor substrate. The plurality of pixels can be arrayed so as to form, for example, a plurality of rows and a plurality of columns. For example, the plurality of pixels can include pixels each having both an imaging function and a focus detection function, but may further include pixels for only imaging or may further include pixels for only focus detection.

Figure 1:
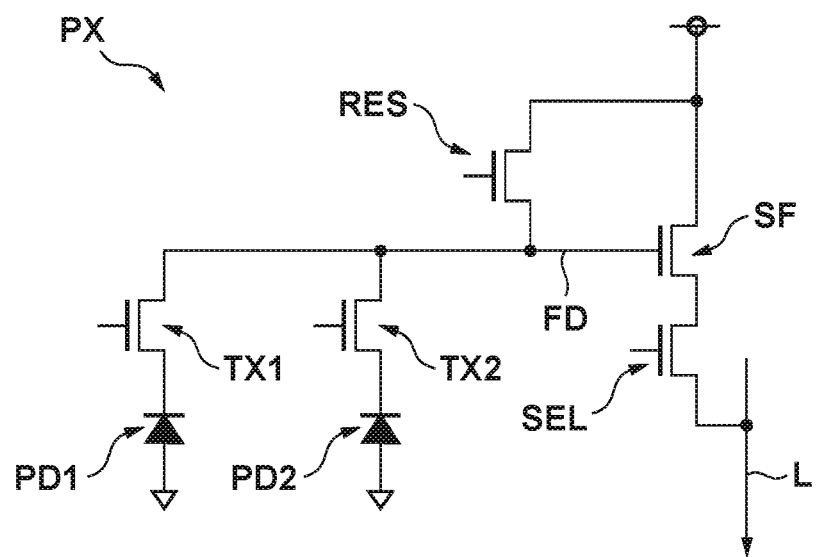
FIG. 1 is a circuit diagram for explaining an example of the arrangement of a unit pixel.

FIG. 1 shows an example of the circuit arrangement of a unit pixel PX. The pixel PX includes a first photoelectric conversion unit PD1, a second photoelectric conversion unit PD2, a first transfer transistor TX1, a second transfer transistor TX2, an amplification transistor SF, a selection transistor SEL, and a reset transistor RES.

A photoelectric conversion element such as a photodiode is used for the photoelectric conversion unit PD1. When a control signal supplied to the gate terminal of the transfer transistor TX1 is activated, the transfer transistor TX1 transfers charges generated and accumulated in the photoelectric conversion unit PD1 to a floating diffusion FD. The same also applies to the photoelectric conversion unit PD2 and the transfer transistor TX2.

A source potential of the amplification transistor SF changes in accordance with the amount of the charges transferred to the floating diffusion FD. When a control signal supplied to the gate terminal of the selection transistor SEL is activated, the selection transistor SEL outputs a signal corresponding to the source potential of the amplification transistor SF to a signal line L. When a control signal supplied to the gate terminal of the reset transistor RES is activated, the reset transistor RES resets a potential of the floating diffusion FD.

A mode has been described here in which an NMOS transistor is used for each transistor such as the transfer transistor TX1. However, a PMOS transistor may be used for each transistor. Examples of several pixel structures will be described below by taking the above-described circuit arrangement as an example.

First Embodiment

FIGS. 2A to 2D show an example of the structure of each pixel PX according to the first embodiment. A description will be made here by using two pixels PX (denoted as a "pixel PX1" and a "pixel PX2", respectively) adjacent to each other in the X direction (first direction), for the sake of descriptive simplicity.

FIG. 2A shows a layout in a plan view with respect to the upper surface of a semiconductor substrate (to be simply referred to as a "plan view" hereinafter). For the sake of illustrative convenience, portions or regions which constitute respective elements formed on a semiconductor substrate are shown. The pixel PX1 includes, for example, a first impurity region R1 of an n type (first conductivity type), an n-type second impurity region R2, a third impurity region R3 of a p type (second conductivity type), an n-type fourth impurity region R4, a p-type fifth impurity region R5, a first gate electrode G1, and a second gate electrode G2.

The impurity region R1 partially forms the photoelectric conversion unit PD1 exemplified in FIG. 1 and is a charge accumulation region in which charges generated by photoelectric conversion are accumulated. The impurity region R2 is formed in a position shifted from the impurity region R1 in the X direction, partially forms the photoelectric conversion unit PD2 exemplified in FIG. 1, and is a charge accumulation region in which the charges generated by photoelectric conversion are accumulated. The impurity region R3 is formed between the impurity region R1 and the impurity region R2, and is an isolation region for electrically isolating them from each other. The impurity region R4 is formed in a position shifted from the impurity region R3 in the Y direction (second direction) intersecting the X direction and is the floating diffusion FD exemplified in FIG. 1.

The gate electrode G1 is arranged between the impurity region R1 and the impurity region R4, and is a gate electrode of the transistor TX1 exemplified in FIG. 1. The gate electrode G2 is arranged between the impurity region R2 and the impurity region R4, and is a gate electrode of the transistor TX2 exemplified in FIG. 1. The impurity region R4 may be formed so as to overlap both the impurity regions R1 and R2 in the Y direction. Each of the gate electrodes G1 and G2 may be formed into a rectangular shape in the X direction and the Y direction.

The impurity region R5 is formed between the gate electrode G1 and the gate electrode G2, and between the impurity region R3 and the impurity region R4. The impurity region R5 is an isolation region for preventing the charges from leaking from the respective impurity regions R1 and R2 into the floating diffusion FD, and the p-type impurity concentration of the impurity region R5 is higher than that of the impurity region R3, a detail of which will be described later. Note that the p-type impurity concentration indicates the net concentration of a p-type impurity in a target region and the region may contain an n-type impurity. The same also applies to an n-type impurity concentration.

The pixel PX1 can further include a p-type sixth impurity region R6 formed at two ends in the X direction. That is, the impurity region R6 is a pixel isolation region for isolating two pixels adjacent to each other in the X direction, and includes the first portion formed on the side of the impurity region R1 opposite to the impurity region R2 and the second portion formed on the side of the impurity region R2 opposite to the impurity region R1. This makes it possible to electrically isolate two adjacent pixels (here, the pixel PX1 and the pixel PX2) described above from each other. Note that the p-type impurity concentration of the impurity region R3 is lower than that of the impurity region R6. In other words, a potential barrier of the impurity region R3 with respect to the accumulated charges in the impurity regions R1 and R2 is lower than that of the impurity region R6 with respect to the charges. For example, this makes it possible to receive excess charges in the impurity region R1 of the pixel PX1 without the excess charges leaking into the pixel PX2 if the accumulated charges are saturated in the impurity region R2 of the pixel PX1.

The pixel PX1 can further include an insulating element isolation portion FLD formed at two ends in the Y direction. The element isolation portion FLD can be made of, for example, silicon oxide. This makes it possible to electrically isolate two pixels adjacent to each other in the Y direction (for example, the pixel PX1 and another pixel (not shown) adjacent to it in the Y direction). Note that in FIG. 2A, regions divided by the element isolation portion FLD and the impurity region R6 are shown, as active regions, with thick lines. In this example, the element isolation portion FLD has been exemplified as having an STI (shallow trench isolation) structure. However, the element isolation portion FLD is not limited to this, but may have a structure formed by, for example, a LOCOS method.

Portions and regions which constitute transistors SF, SEL and RES are not shown here, for the sake of descriptive simplicity. A description has been made above about the pixel PX1. However, the same also applies to the pixel PX2. The structures of the pixels PX1 and PX2 are not limited to the above-described example, but another well-known technique may be applied to them. For example, the charge accumulation regions (impurity regions R1 and R2) may be formed as so-called "buried" regions. That is, a p-type heavily doped impurity region may be arranged between the upper surface of the semiconductor substrate, and the respective impurity regions R1 and R2.

FIG. 2B does not show the gate electrodes G1 and G2 of FIG. 2A. In this example, a semiconductor region immediately below the gate electrodes G1 and G2 is of the n-type, and the respective transistors TX1 and TX2 can be turned off by applying a negative bias to the gate electrodes G1 and G2. Note that a pixel arrangement is not limited to this example. The pixels may be arranged such that the respective transistors TX1 and TX2 are turned off by applying 0 [V] to the gate electrodes G1 and G2.

Figure 2C:
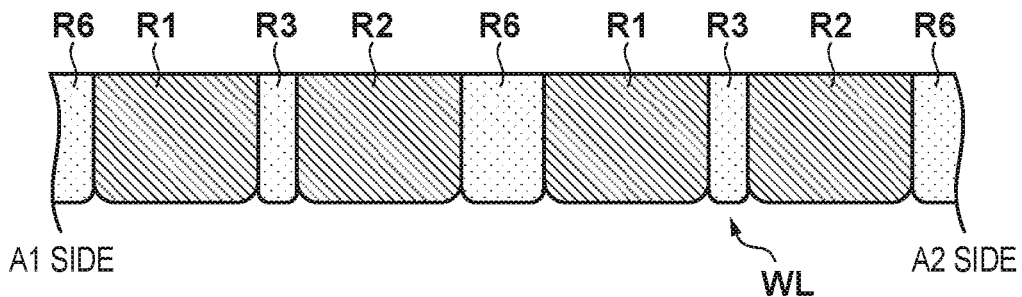
Figure 2D:
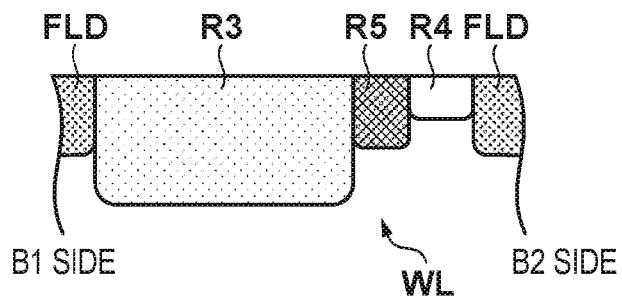

FIG. 2C shows a sectional structure taken along a cut line A1-A2 of FIG. 2A. FIG. 2D shows a sectional structure taken along a cut line B1-B2 of FIG. 2A. The respective impurity regions such as the impurity region R1 described above can be formed in a p-type well WL by an implantation method or the like.

Figure 3A:
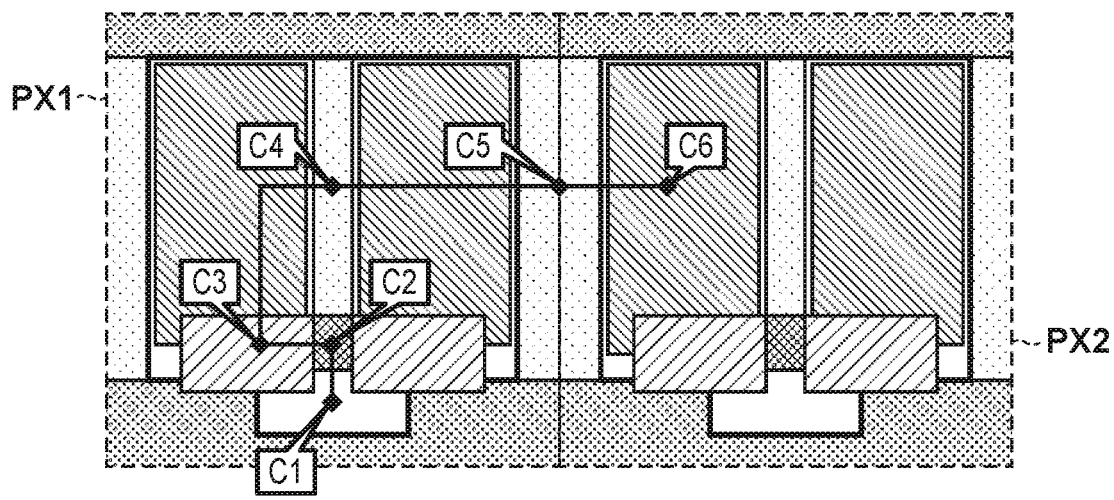
FIGS. 3A and 3B are a sectional view and a graph for explaining an example of a potential distribution.
Figure 3B:
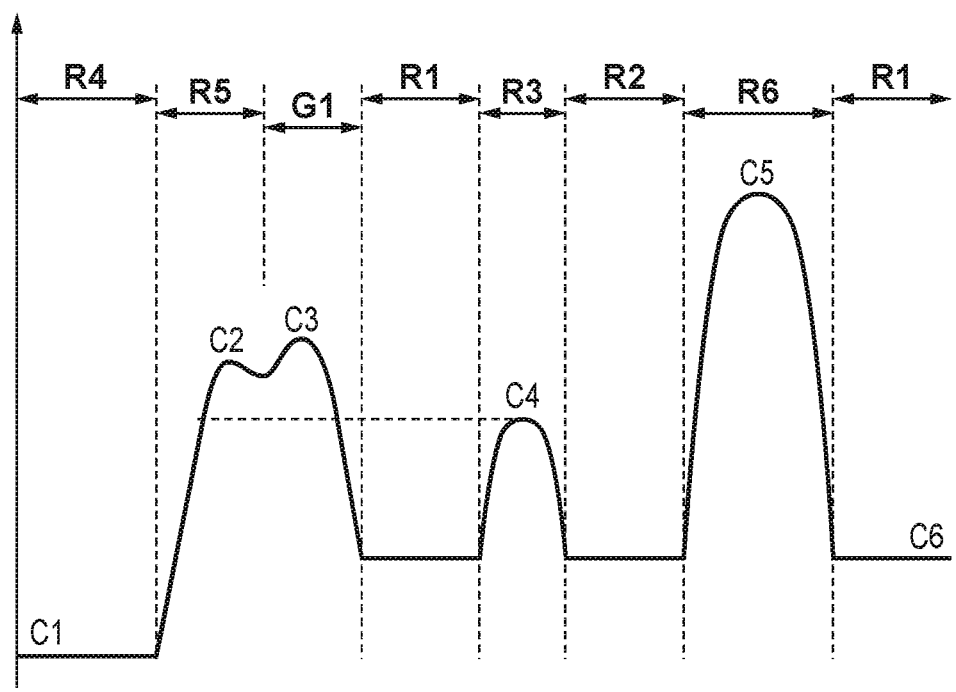

FIG. 3A is a view showing (as in FIG. 2A) the layout of the pixels PX1 and PX2. FIG. 3B shows a potential distribution on the upper surface of the semiconductor substrate taken along a cut line C1 to C6 of FIG. 3A when the transistors TX1 and TX2 are turned off. The point C1 corresponds to the impurity region R4 (that is, the floating diffusion FD) of the pixel PX1. The point C2 corresponds to the impurity region R5 of the pixel PX1. The point C3 corresponds to a region (a region in which a channel of the transistor TX1 is formed) immediately below the gate electrode G1 of the pixel PX1. The point C4 corresponds to the impurity region R3 of the pixel PX1. The point C5 corresponds to the impurity region R6 (the pixel isolation region between the pixel PX1 and the pixel PX2). A potential barrier at the point C5 is higher than that at the point C4. The point C6 corresponds to the impurity region R1 (that is, a part of the photoelectric conversion unit PD1) of the pixel PX2.

Referring to FIG. 3B, a potential barrier at the point C3 is higher than that at the point C4 and a potential barrier at the point C2 is higher than that at the point C4. This makes it possible to prevent the excess charges from leaking into the impurity region R4 if the accumulated charges in one of the impurity regions R1 and R2 are saturated under a state in which the transistors TX1 and TX2 are turned off. That is, the impurity region R5 having the high potential barrier is formed between the impurity region R3 and the impurity region R4. It is therefore possible to prevent the excess charges from leaking from the impurity region R1 or R2 into the impurity region R4 via the impurity region R3 if the accumulated charged are saturated in the impurity region R1 or R2.

Figure 4A:
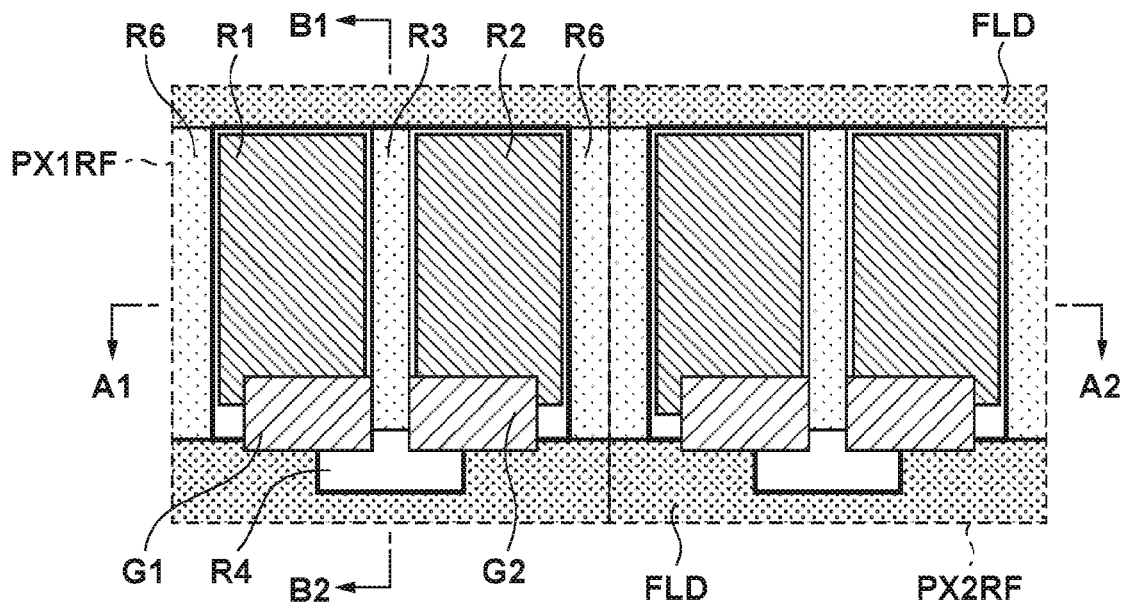
FIGS. 4A to 4E are sectional views and a graph for explaining an example of the structure of each pixel and the potential distribution in a reference example.
Figure 4B:
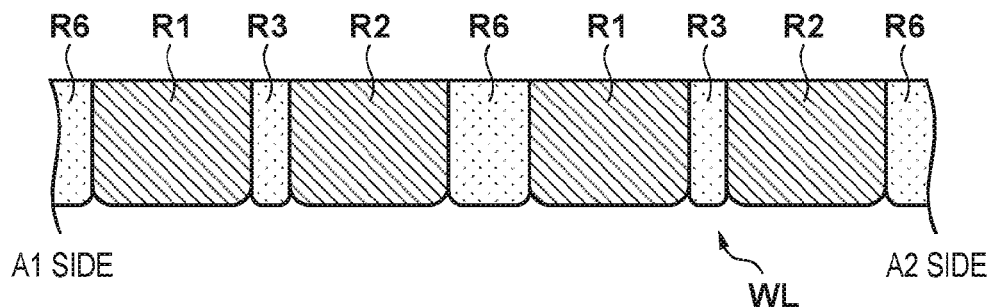
Figure 4C:
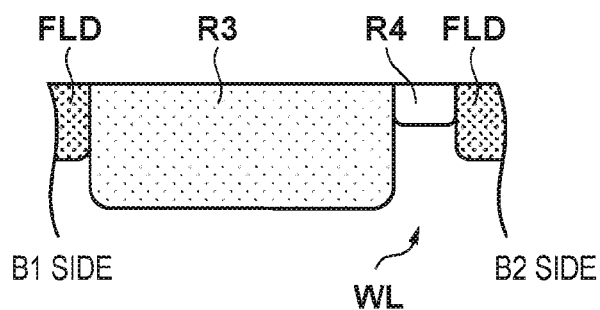
Figure 4D:
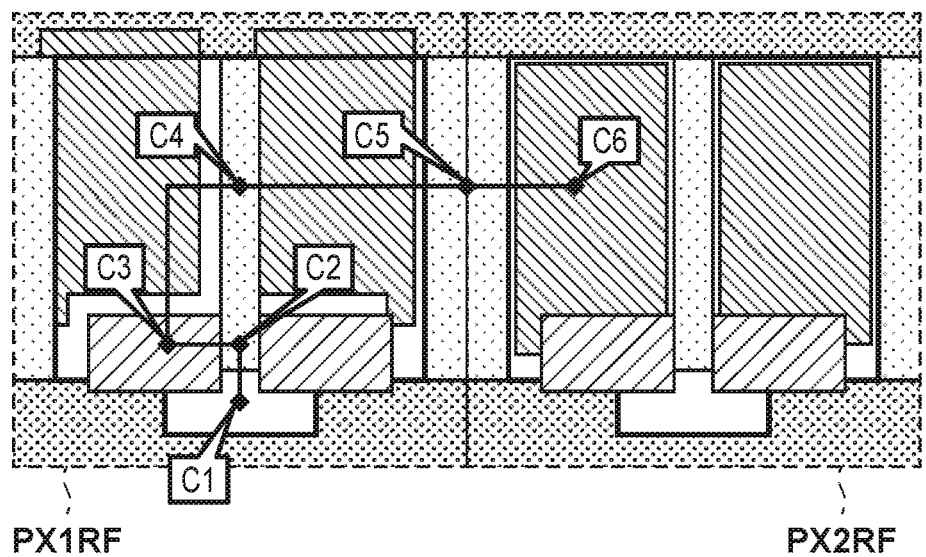
Figure 4E:
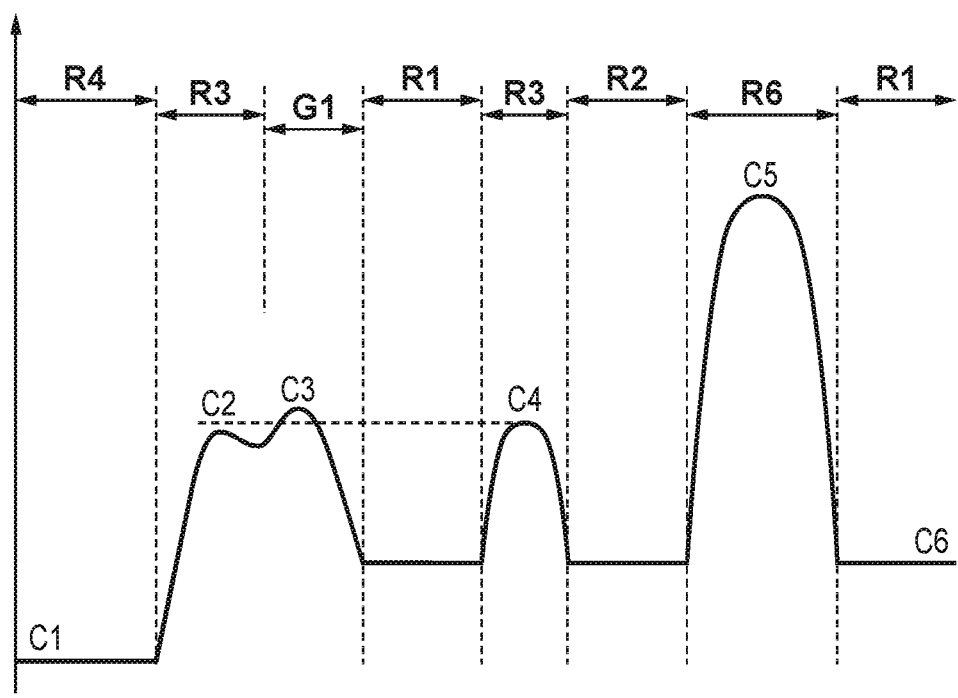

FIGS. 4A to 4E shows, as a reference example, layout views, sectional structures, a potential distribution, and the like of a pixel PX1RF and a pixel PX2RF adjacent to each other in the X direction. The pixel PX1RF and the pixel PX2RF are the same in structure as the above-described pixel PX1 and pixel PX2 except that they do not include the impurity region R5. FIG. 4A corresponds to FIG. 2A, FIG. 4B corresponds to FIG. 2B, FIG. 4C corresponds to FIG. 2C, FIG. 4D corresponds to FIG. 3A, and FIG. 4E corresponds to FIG. 3B.

According to the above-described reference example, for example, in the pixel PX1RF, the impurity region R5 is not formed between the impurity region R3 and the impurity region R4, and thus the potential barrier at the point C2 and the potential barrier at the point C4 are almost equal to each other. Therefore, the excess charges may leak into the impurity region R4 if the accumulated charges in one of the impurity regions R1 and R2 are saturated under the state in which the transistors TX1 and TX2 are turned off.

For example, if the accumulated charges are saturated in the impurity region R1, while some of the excess charges move from the impurity region R1 to the impurity region R2 via the impurity region R3, some other charges of the excess charges may leak from the impurity region R1 into the impurity region R4 via the impurity region R3. In one case, this may prevent the transistor TX1 from transferring the accumulated charges (saturated charges) from the impurity region R1 to the impurity region R4 (floating diffusion FD) sufficiently (the dynamic range of a pixel signal is decreased). In another case, some signal components are lost when the transistor RES resets the impurity region R4 (floating diffusion FD). In still another case, when a correlated double sampling (CDS) method or the like is performed, a noise component or an offset component is changed. As a result, the signal components may not be obtained appropriately.

To cope with this, according to this embodiment, it is possible to prevent, by the impurity region R5, the excess charges from leaking from the impurity region R1 or R2 into the impurity region R4 via the impurity region R3 if the accumulated charges are saturated in the impurity region R1 or R2, as described above.

Figure 5:
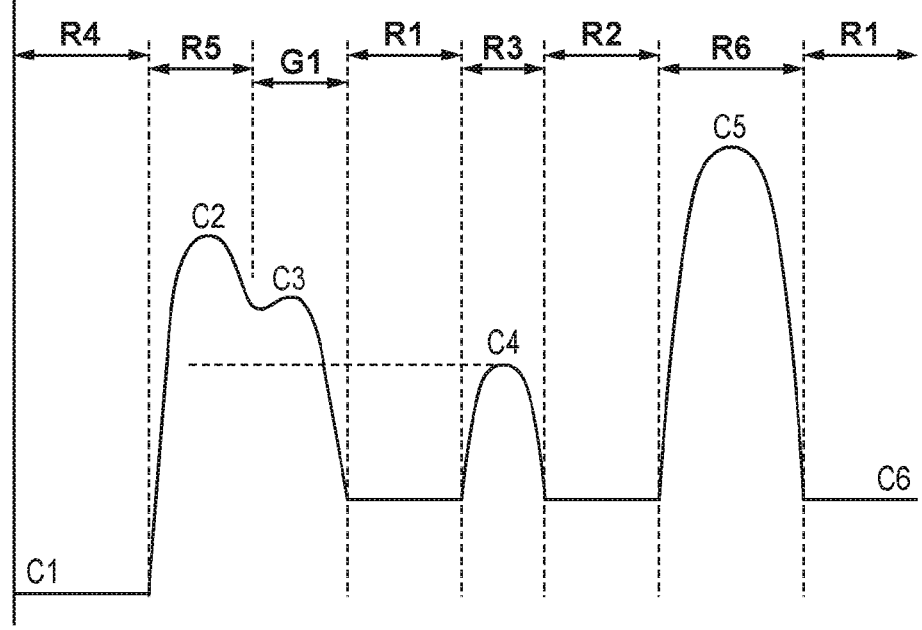
FIG. 5 is a graph for explaining an example of the potential distribution.

As exemplified in FIG. 5, for example, the potential barrier at the point C2 may be made higher than that at the point C3 by further increasing the p-type impurity concentration of the impurity region R5. In this case, a potential at the point C3 can be higher than that in the example of FIG. 3B under the influence of an electric field from the impurity region R5 having the highly-concentrated potential in the region immediately below the gate electrode G1. This is equivalent to increasing a threshold voltage of the transistor TX1. According to this example, it is also possible to further reduce leakage of the excess charges into the impurity region R4 via the impurity region R3 and to decrease a leakage amount in the transistor TX1. Note that the value of an activated voltage may be adjusted when the transistor TX1 is turned on. This also applies to the transistor TX2 and the gate electrode G2.

Figure 6A:
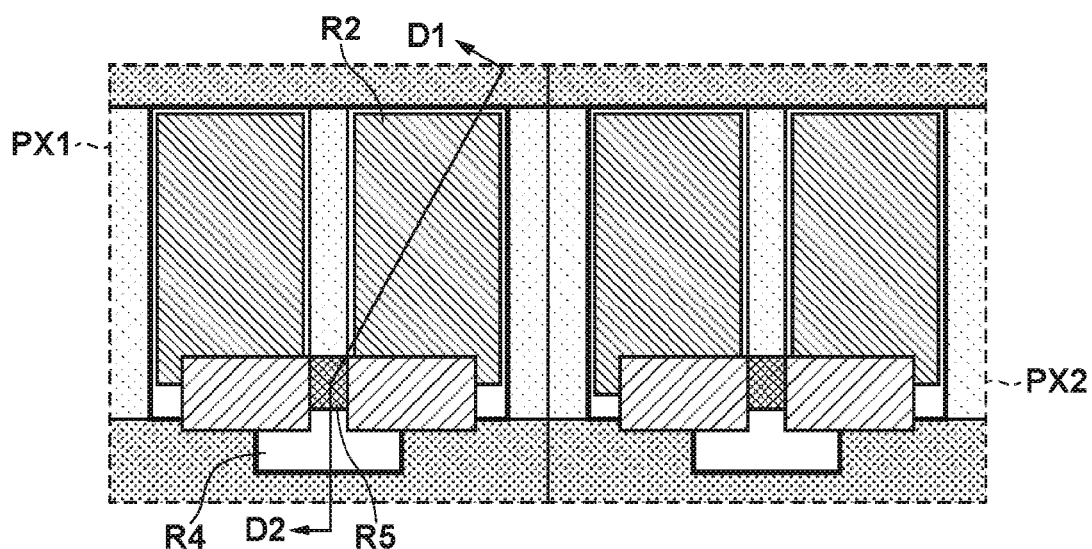
FIGS. 6A and 6B are sectional views for explaining an example of the structure of each pixel.
Figure 6B:
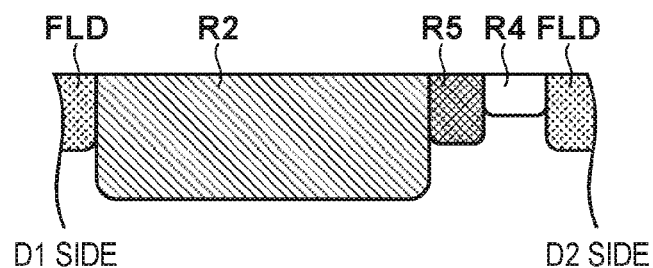

FIG. 6A is a view showing (as in FIG. 2A) the layout of the pixels PX1 and PX2. FIG. 6B shows a sectional structure taken along a cut line D1-D2 of FIG. 6A. The impurity region R5 is preferably formed deeper than at least the impurity region R4. In this example, the impurity region R5 is formed such that its bottom surface is deeper than the bottom surface of the impurity region R4 and shallower than the bottom surface of the impurity region R2.

The "bottom surface" of each impurity region indicates the interface between the impurity region and another region positioned below the impurity region. When the conductivity type of the impurity region and the conductivity type of the other region are different from each other, for example, the bottom surface may be specified by setting, as the interface, a position where the conductivity type changes. When the conductivity type of the impurity region and the conductivity type of the other region are the same, for example, the bottom surface may be specified by setting, as the interface, a position where the type of a dominant impurity between them changes. In another example, the bottom surface may be specified by setting, as the interface, a position where the net impurity concentration between them changes, for example, by two or more orders of magnitude.

Note that the charges are likely to be accumulated in a region having the particularly high impurity concentration.

It is therefore preferable, in a depth direction from the upper surface of the semiconductor substrate, that the peak position of the impurity concentration in the impurity region R5 is positioned between the peak position of the impurity concentration in the impurity region R2 and the peak position of the impurity concentration in the impurity region R4. This makes it possible to prevent leakage of the excess charges from the impurity region R2 into the impurity region R4 effectively.

In other embodiments, the impurity region R5 may be formed such that its bottom surface is at the same depth as or deeper than the bottom surface of the impurity region R2. This also makes it possible to prevent the excess charges from leaking from a relatively deep portion out of the impurity region R2 into the impurity region R4.

The positional relationship of the impurity region R5 with the impurity region R2 has been described here with reference to the sectional structure taken along the cut line D1-D2. However, the same also applies to the positional relationship with the impurity region R1. In the other embodiments, the above-described positional relationship may be satisfied with respect to one of the impurity regions R1 and R2.

A solid-state image sensor including the above-described pixel PX1 and the like can be manufactured by using a well-known semiconductor manufacturing technique. FIGS. 7A1 to 7A4 and 7B1 to 7B4 show an example of steps of forming the impurity region R5 in a method of manufacturing this solid-state image sensor. FIGS. 7A1 to 7A4, respectively, are views showing the layout of the unit pixel PX1 in each step. FIGS. 7B1 to 7B4, respectively, show sectional structures taken along a cut line E1-E2 of FIGS. 7A1 to 7A4.

FIG. 7A1 shows the view of the layout of the unit pixel PX1 in a state after the impurity region R3 is formed on the well WL. In the step of FIGS. 7A1 and 7B1, a resist pattern PR1 having an opening OP1 on a region where the impurity region R5 should be formed is formed on the semiconductor substrate. Next, in the step of FIGS. 7A2 and 7B2, an impurity is implanted into the well WL via the opening OP1, thereby forming the impurity region R5. Then, the resist pattern PR1 is removed. In the step of FIGS. 7A3 and 7B3, the impurity regions R1 and R2 are formed, in the same procedure, on the well WL by using another resist pattern. Finally, in the step of FIGS. 7A4 and 7B4, the gate electrodes G1 and G2 are formed on the semiconductor substrate.

Note that, for example, boron (B) can be used for the p-type impurity and phosphorus (P) or arsenic (As) can be used for the n-type impurity. For example, the well WL and the impurity region R5 can be formed by implanting boron, and the impurity regions R1 and R2 can be formed by implanting arsenic. For the gate electrodes G1 and G2, for example, polysilicon can be used. Further, a wafer process step such as annealing or a cleaning process may be inserted between the above-described respective steps as needed, though a description thereof has been omitted.

A method of forming the impurity region R5 is not limited to the above-described example. For example, the impurity region R5 may be formed after the gate electrodes G1 and G2 are formed. According to this method, it is possible to prevent an influence on the impurity region R5 (for example, thermal diffusion of the impurity) caused by annealing when forming the gate electrodes G1 and G2.

Modification

As described above, charge accumulation regions (impurity regions R1 and R2) may be formed as buried regions in this embodiment. A case will be described below in which a buried arrangement is adopted.

Figure 12A:
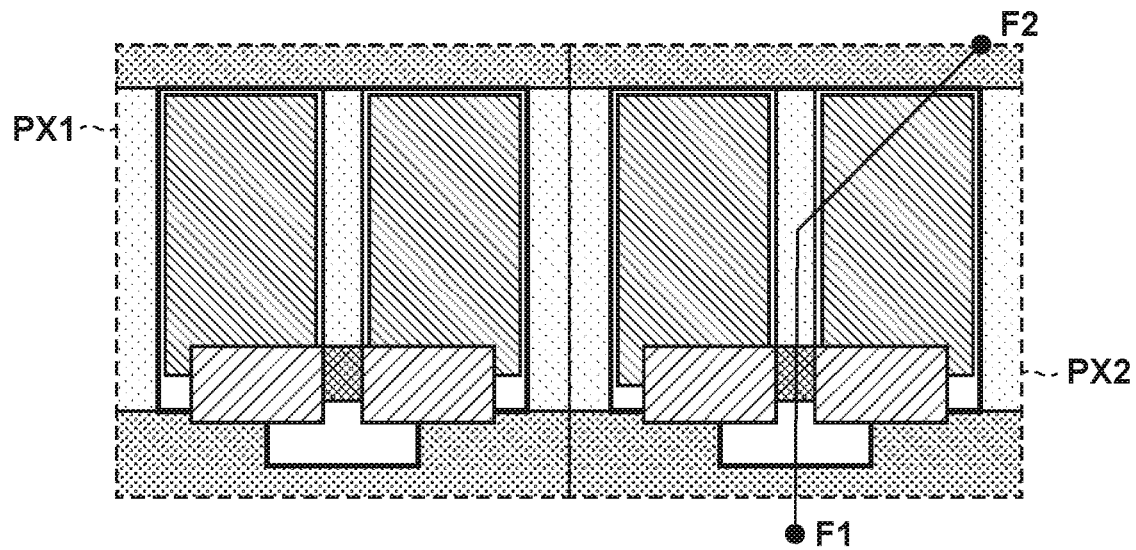
FIGS. 12A and 12B are sectional views for explaining an example of the structure of each pixel.
Figure 12B:
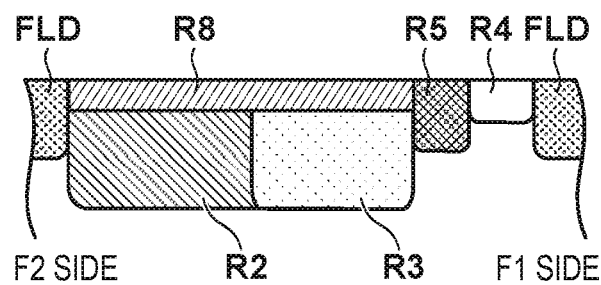

FIG. 12A shows, in a plan view, the layout of two pixels PX1 and PX2 adjacent to each other in the X direction. FIG. 12B shows a sectional structure taken along a cut line F1-F2 of FIG. 12A.

A p-type eighth impurity region R8 is provided between the n-type second impurity region R2 and the upper surface of a semiconductor substrate. The eighth impurity region R8 is also provided between a p-type third impurity region R3 and the upper surface of the semiconductor substrate. A buried photoelectric conversion unit is formed by this eighth impurity region R8. As described above, the impurity concentration of a fifth impurity region R5 is higher than that of the impurity region R3.

As shown in FIG. 12B, the eighth impurity region R8 may not be provided between the p-type fifth impurity region R5 and the upper surface of the semiconductor substrate. In another example, however, the eighth impurity region R8 may be provided between the fifth impurity region R5 and the upper surface of the semiconductor substrate. The impurity concentration of the fifth impurity region R5 is lower than that of the eighth impurity region R8.

The positions of the respective semiconductor regions R3, R5, and R8 described above (the positions in the depth direction of the semiconductor substrate) are arranged in the order of the third impurity region R3, the fifth impurity region R5, and the eighth impurity region R8 from the deeper side to the upper surface side of the semiconductor substrate. Note that the positions of the respective semiconductor regions R3, R5, and R8 may be determined depending on, for example, their peak positions of the impurity concentrations. In this example, out of the respective semiconductor regions R3, R5, and R8, setting can be made such that the impurity concentration of the eighth impurity region R8 is the highest, the impurity concentration of the fifth impurity region R5 is the second highest, and the impurity concentration of the third impurity region R3 is the lowest.

Second Embodiment

Figure 8A:
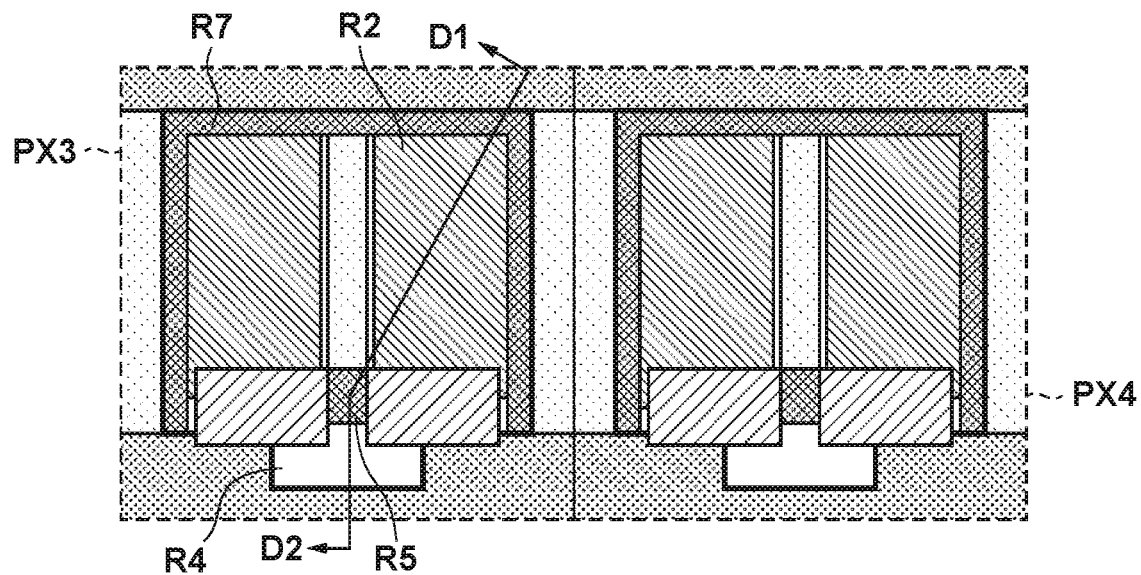
FIGS. 8A and 8B are sectional views for explaining an example of the structure of each pixel.
Figure 8B:
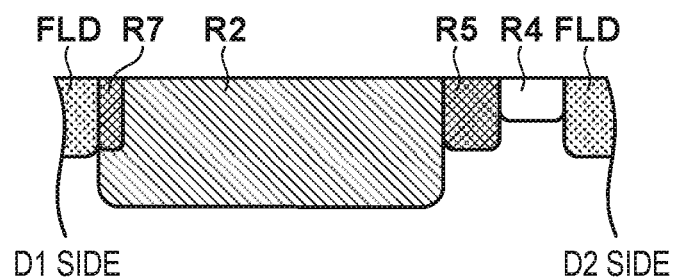

The second embodiment will be described with reference to FIGS. 8A and 8B. FIG. 8A shows, in a plan view, the layout of two pixels PX (denoted as a "pixel PX3" and a "pixel PX4", respectively) adjacent to each other in the X direction. FIG. 8B shows a sectional structure taken along a cut line D1-D2 of FIG. 8A.

This embodiment is different from the aforementioned first embodiment mainly in that, as exemplified in FIG. 8A, a p-type seventh impurity region R7 is formed along the outer edge of each active region in a plan view. The impurity region R7 is preferably formed at the boundary between the active regions and an element isolation portion FLD, and its proximity. This makes it possible to suppress an influence, on an impurity region R2, of a dark current caused by an interface trap at the boundary, as exemplified in FIG. 8B. Therefore, a charge generated by photoelectric conversion in a photoelectric conversion unit PD2 can be accumulated in the impurity region R2 appropriately. This also applies to a photoelectric conversion unit PD1 and an impurity region R1.

The impurity region R7 may be formed with an impurity region R5 in an implantation step for forming the impurity region R5. In this case, it can also be said that the impurity concentration profile of the impurity region R5 and the impurity concentration profile of the impurity region R7 are equal to each other in the depth direction from the upper surface of a semiconductor substrate.

Figure 9A:
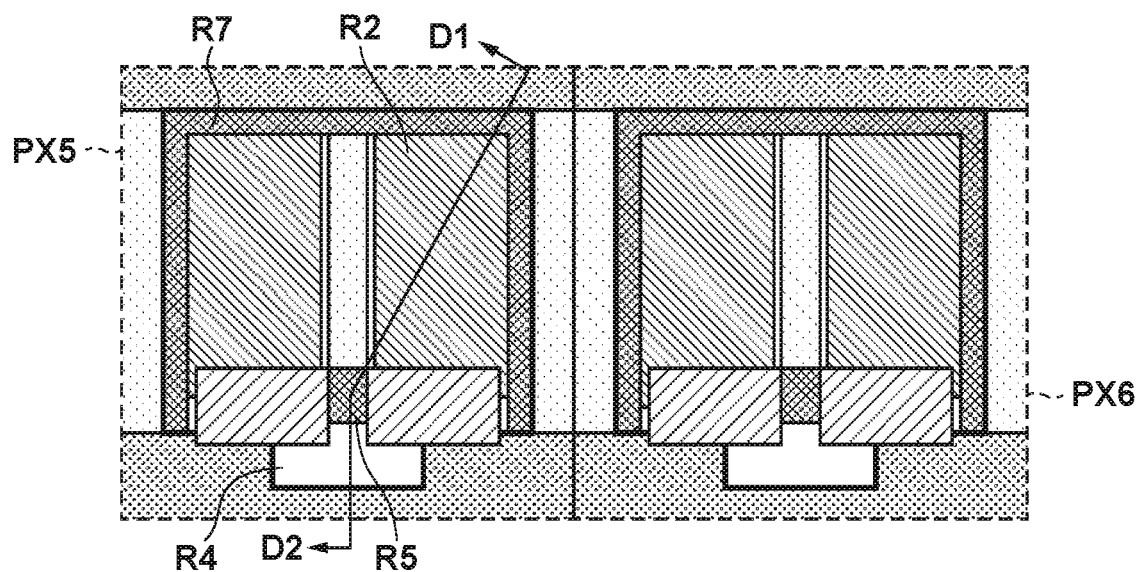
FIGS. 9A and 9B are sectional views for explaining an example of the structure of each pixel.
Figure 9B:
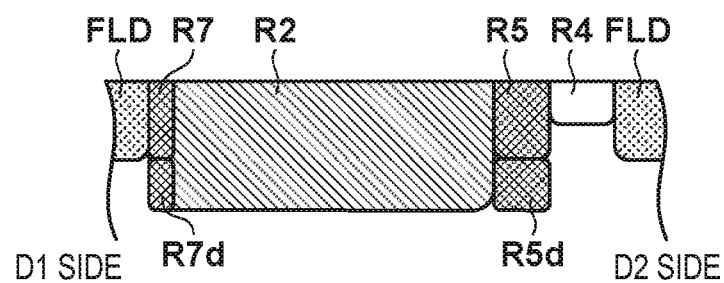

As an application, FIG. 9A shows, in a plan view, the layout of two pixels PX (denoted as a "pixel PX5" and a "pixel PX6", respectively) adjacent to each other in the X direction. FIG. 9B shows a sectional structure taken along a cut line D1-D2 of FIG. 9A. In this example, a p-type impurity region R5$d$ is formed so as to contact the impurity region R5 in a position deeper than the impurity region R5, and a p-type impurity region R7$d$ is formed so as to contact the impurity region R7 in a position deeper than the impurity region R7. The impurity region R5$d$ and the impurity region R7$d$ may be formed together by performing impurity implantation step once.

In another viewpoint, the impurity regions R5 and R7 may be formed, by performing two or more impurity implantation operations different in implantation energy, such that their bottom surfaces are at the same depth or deeper than the bottom surface of the impurity region R2.

In this example, the peak position of the impurity concentration in the impurity region R2 is preferably positioned between the peak position of the impurity concentration of the impurity region R7 and the peak position of the impurity concentration of the impurity region R7$d$ in the depth direction from the upper surface of the semiconductor substrate. This makes it possible to suppress the influence, on the impurity region R2, of the dark current caused by the interface trap at the boundary between each active region and the element isolation portion FLD more effectively. Since the impurity region R5$d$ has been formed, it is also possible to prevent excess charges from leaking from a relatively deep portion out of the impurity region R2 into the impurity region R4.

Third Embodiment

FIGS. 10A1 to 10A4 and 10B1 to 10B4 show an example of steps of forming an impurity region R5 out of a method of manufacturing a solid-state image sensor according to the third embodiment. FIGS. 10B1 to 10A4, respectively, are views showing the layout of a unit pixel PX in each step. FIGS. 10B1 to 10B4, respectively, show sectional structures taken along a cut line E1-E2 of FIGS. 10A1 to 10A4.

FIG. 10A1 shows the view of the layout of the unit pixel PX in a state after impurity regions R1 and R2 are formed on a well WL. In the step of FIGS. 10A1 and 10B1, a desired resist pattern is formed on a semiconductor substrate, and the impurity regions R1 and R2 are formed by implanting an impurity into the well WL by using the resist pattern. Next, in the step of FIGS. 10A2 and 10B2, gate electrodes G1 and G2 are formed on the semiconductor substrate.

Then, in the step of FIGS. 10A3 and 10B3, a resist pattern PR2 having an opening OP2 on a region between the gate electrode G1 and the gate electrode G2 is formed on the substrate. As shown in FIG. 10B3, the opening OP2 may be larger than a width between the gate electrode G1 and the gate electrode G2. That is, the outer edge of the opening OP2 may be positioned outside the edge of the gate electrode G1 on the side of the gate electrode G2 and may be positioned outside the edge of the gate electrode G2 on the side of the gate electrode G1.

Finally, in the step of FIGS. 10A4 and 10B4, the impurity region R5 is formed by implanting an impurity into the well WL via the opening OP2. At this time, the gate electrodes G1 and G2 act as masks, and the impurity region R5 is formed between the gate electrode G1 and the gate electrode G2 in a plan view.

According to this embodiment, impurity implantation for forming the impurity region R5 is performed by self-alignment using the gate electrodes G1 and G2. It is therefore possible to reduce an influence on the characteristics of the pixel PX caused by an alignment error of the resist pattern PR2 formed in the step of FIGS. 10A3 and 10B3.

Others

Some preferred embodiments have been exemplified above. However, the present invention is not limited to these embodiments. The present invention may change some of the embodiments or combine the respective characteristics of the respective embodiments, without departing from the scope of the present invention.

Imaging System

FIG. 11 is a block diagram for explaining an example of the arrangement of a camera to which a solid-state image sensor 100 including the pixels PX exemplified in the respective embodiments described above is applied. In addition to the solid-state image sensor 100, the camera includes, for example, a processing unit 200, a CPU 300 (or a processor), an operation unit 400, and an optical system 500. The camera can further include a display unit 600 configured to display a still image and a moving image to a user, and a memory 700 configured to store their data. The solid-state image sensor 100 generates image data based on light that has passed through the optical system 500. The image data undergoes predetermined correction processing by the processing unit 200, and is output to the display unit 600 and the memory 700. In accordance with a shooting condition input by the user via the operation unit 400, the CPU 300 can change setting information of each unit or a method of controlling each unit. Note that the concept of the camera includes not only apparatuses primarily aiming at shooting but also apparatuses (for example, a personal computer and a portable terminal) secondarily having a shooting function.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2015-113350 filed on Jun. 3, 2015 and 2016-032425 filed on Feb. 23, 2016, which are hereby incorporated by reference herein in their entirety.

What is claimed is:

1. A solid-state image sensor which includes a plurality of pixels arranged on a semiconductor substrate,
   wherein in a plan view with respect to an upper surface of the semiconductor substrate, each pixel includes
   a first impurity region of a first conductivity type configured to accumulate charges generated by photoelectric conversion,
   a second impurity region of the first conductivity type formed in a position shifted from the first impurity region in a first direction and configured to accumulate the charges generated by the photoelectric conversion,
   a third impurity region of a second conductivity type formed between the first impurity region and the second impurity region, a fourth impurity region of the first conductivity type formed in a position shifted from the third impurity region in a second direction intersecting the first direction, a first gate electrode of a transistor arranged between the first impurity region and the fourth impurity region and configured to transfer the charges from the first impurity region to the fourth impurity region, a second gate electrode of a transistor arranged between the second impurity region and the fourth impurity region and configured to transfer the charges from the second impurity region to the fourth impurity region, and a fifth impurity region of the second conductivity type formed between the first gate electrode and the second gate electrode, and between the third impurity region and the fourth impurity region, and a concentration of an impurity of the second conductivity type in the fifth impurity region is higher than a concentration of an impurity of the second conductivity type in the third impurity region.

2. The sensor according to claim 1, wherein the fourth impurity region is formed so as to overlap both the first impurity region and the second impurity region in the second direction.

3. The sensor according to claim 1, wherein each pixel further includes, in the plan view, a sixth impurity region which includes a first portion formed on a side of the first impurity region opposite to the second impurity region and a second portion formed on a side of the second impurity region opposite to the first impurity region, and the concentration of the impurity of the second conductivity type in the third impurity region is lower than a concentration of an impurity of the second conductivity type in the sixth impurity region.

4. The sensor according to claim 1, wherein in the plan view, each pixel further includes an insulating element isolation portion formed on sides of the first impurity region, the second impurity region, and the third impurity region, respectively, opposite to the fourth impurity region, and a seventh impurity region of the second conductivity type formed between the element isolation portion and the first impurity region, between the element isolation portion and the second impurity region, and between the element isolation portion and the third impurity region.

5. The sensor according to claim 4, wherein an impurity concentration profile of the fifth impurity region in a depth direction from the upper surface of the semiconductor substrate and an impurity concentration profile of the seventh impurity region in the depth direction are equal to each other.

6. The sensor according to claim 1, wherein the fifth impurity region is formed such that a bottom surface of the fifth impurity region is deeper than a bottom surface of the fourth impurity region, and is shallower than both bottom surfaces of the first impurity region and the second impurity region.

7. The sensor according to claim 6, wherein in the depth direction from the upper surface of the semiconductor substrate, a peak position of an impurity concentration in the fifth impurity region is positioned between a peak position of an impurity concentration in the fourth impurity region, and at least one of a peak position of an impurity concentration in the first impurity region and a peak position of an impurity concentration in the second impurity region.

8. The sensor according to claim 1, wherein the fifth impurity region is formed such that a bottom surface of the fifth impurity region is one of at the same depth or deeper than both bottom surfaces of the first impurity region and the second impurity region.

9. A solid-state image sensor which includes a plurality of pixels arranged on a semiconductor substrate, wherein in a plan view with respect to an upper surface of the semiconductor substrate, each pixel includes a first impurity region of a first conductivity type configured to accumulate charges generated by photoelectric conversion, a second impurity region of the first conductivity type formed in a position shifted from the first impurity region in a first direction and configured to accumulate the charges generated by the photoelectric conversion, a third impurity region of a second conductivity type formed between the first impurity region and the second impurity region, a fourth impurity region of the first conductivity type formed in a position shifted from the third impurity region in a second direction intersecting the first direction, a first gate electrode of a transistor arranged between the first impurity region and the fourth impurity region and configured to transfer the charges from the first impurity region to the fourth impurity region, a second gate electrode of a transistor arranged between the second impurity region and the fourth impurity region and configured to transfer the charges from the second impurity region to the fourth impurity region, and a fifth impurity region of the second conductivity type formed between the first gate electrode and the second gate electrode, and between the third impurity region and the fourth impurity region, and a potential barrier of the fifth impurity region with respect to the charges accumulated in both the first impurity region and the second impurity region is higher than a potential barrier of the third impurity region with respect to the charges.

10. A camera comprising:

a solid-state image sensor; and a processing unit configured to process a signal output from the solid-state image sensor, wherein the solid-state image sensor includes a plurality of pixels arranged on a semiconductor substrate, in a plan view with respect to an upper surface of the semiconductor substrate, each pixel includes a first impurity region of a first conductivity type configured to accumulate a charge generated by photoelectric conversion, a second impurity region of the first conductivity type formed in a position shifted from the first impurity region in a first direction and configured to accumulate the charges generated by the photoelectric conversion, a third impurity region of a second conductivity type formed between the first impurity region and the second impurity region, a fourth impurity region of the first conductivity type formed in a position shifted from the third impurity region in a second direction intersecting the first direction, a first gate electrode of a transistor arranged between the first impurity region and the fourth impurity region and configured to transfer the charges from the first impurity region to the fourth impurity region, a second gate electrode of a transistor arranged between the second impurity region and the fourth impurity region and configured to transfer the charges from the second impurity region to the fourth impurity region, and a fifth impurity region of the second conductivity type formed between the first gate electrode and the second gate electrode, and between the third impurity region and the fourth impurity region, and a concentration of an impurity of the second conductivity type in the fifth impurity region is higher than a concentration of an impurity of the second conductivity type in the third impurity region.

* * * * *